United States Patent [19]
Asaba et al.

[11] Patent Number: 6,128,052
[45] Date of Patent: Oct. 3, 2000

[54] SEMICONDUCTOR DEVICE APPLICABLE FOR LIQUID CRYSTAL DISPLAY DEVICE, AND PROCESS FOR ITS FABRICATION

[75] Inventors: Tetsuo Asaba, Odawara; Masaru Sakamoto; Yutaka Genchi, both of Atsugi, all of Japan

[73] Assignee: Canon Kabushiki Kaisha, Tokyo, Japan

[21] Appl. No.: 08/851,269

[22] Filed: May 5, 1997

Related U.S. Application Data

[63] Continuation of application No. 08/614,101, Mar. 12, 1996, abandoned, which is a continuation of application No. 08/172,103, Dec. 23, 1993, abandoned.

[30]  Foreign Application Priority Data

Dec. 25, 1992 [JP] Japan ............................. 4-357746
Jan. 28, 1993 [JP] Japan ............................. 5-031165
Jun. 7, 1993 [JP] Japan ............................. 5-160019

[51] Int. Cl.⁷ .................................................. G02F 1/136
[52] U.S. Cl. .......................... 349/42; 349/43; 257/59; 257/72

[56]  References Cited

U.S. PATENT DOCUMENTS

| | | | |
|---|---|---|---|
| 4,838,654 | 6/1989 | Hamaguchi et al. | 359/59 |
| 5,258,320 | 11/1993 | Zavracky et al. | 437/40 |
| 5,258,323 | 11/1993 | Sarma et al. | 437/63 |
| 5,258,325 | 11/1993 | Spitzer et al. | 437/86 |
| 5,281,840 | 1/1994 | Sarma | 257/351 |
| 5,343,064 | 8/1994 | Spangler et al. | 257/350 |
| 5,434,433 | 7/1995 | Takasu et al. | 257/59 |

FOREIGN PATENT DOCUMENTS

| | | |
|---|---|---|
| 0281324 | 9/1988 | European Pat. Off. . |
| 0474474 | 3/1992 | European Pat. Off. . |
| 0530972 | 3/1993 | European Pat. Off. . |
| 2204980 | 11/1988 | United Kingdom . |

Primary Examiner—James A Dudek
Attorney, Agent, or Firm—Fitzpatrick, Cella, Harper & Scinto

[57]  ABSTRACT

A semiconductor device comprises a substrate comprising a semiconductor monocrystalline substrate on one principal surface side of which a light-transmitting film is formed, the substrate being prepared by removing from the other principal surface side thereof a semiconductor monocrystalline region present right beneath the light-transmitting film, a non-monocrystalline semiconductor element formed on the light-transmitting film, and a monocrystalline semiconductor element formed in a semiconductor monocrystalline region remaining in the substrate, the non-monocrystalline semiconductor element and the monocrystalline semiconductor element being electrically connected.

28 Claims, 11 Drawing Sheets

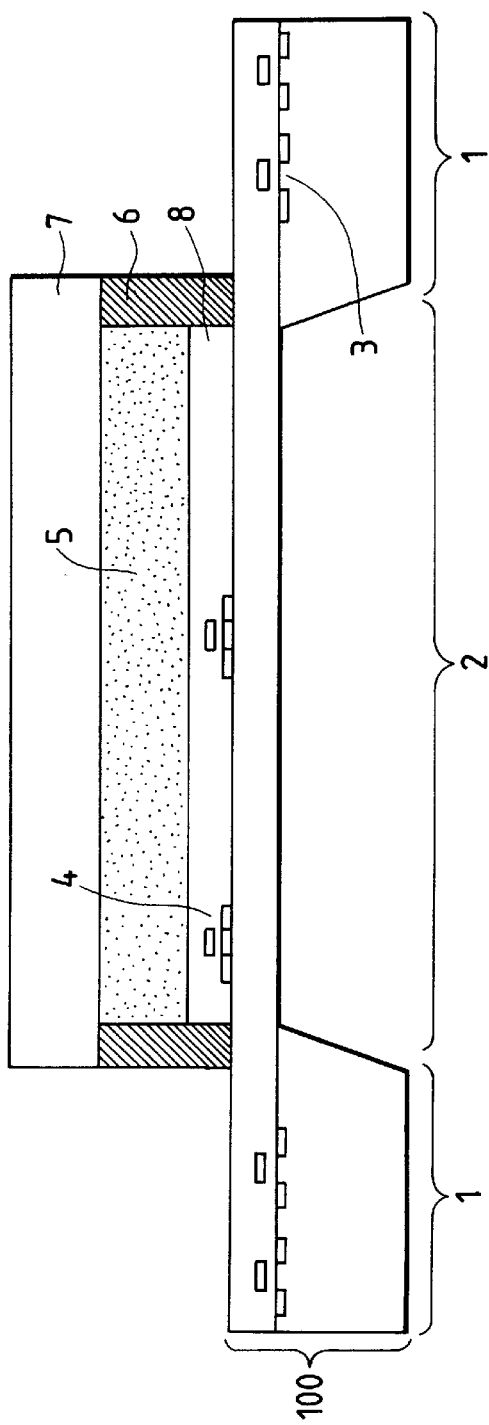
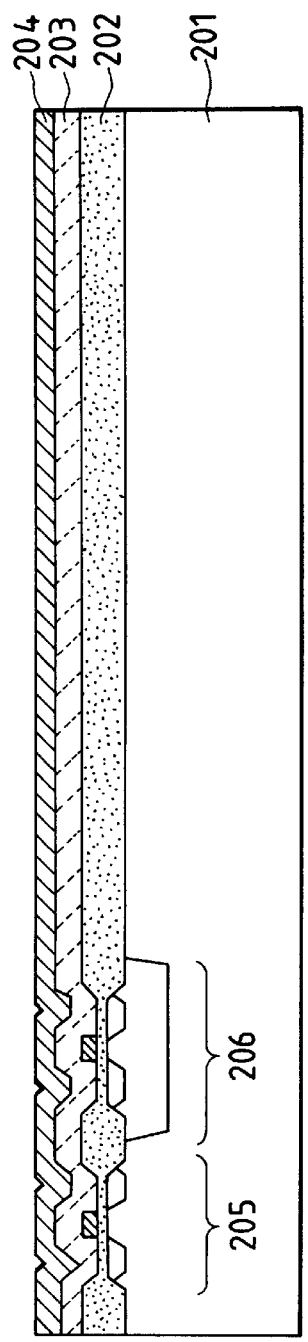

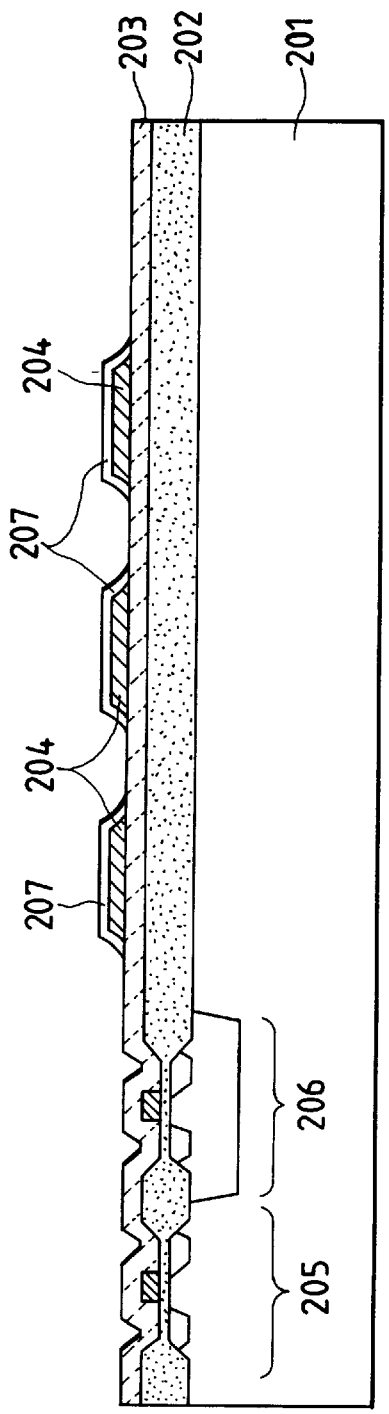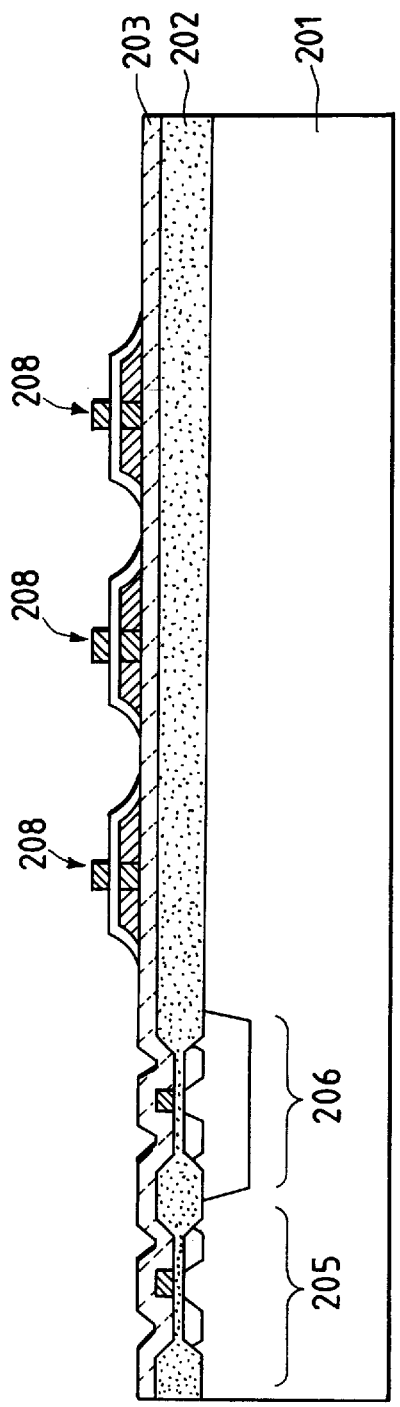

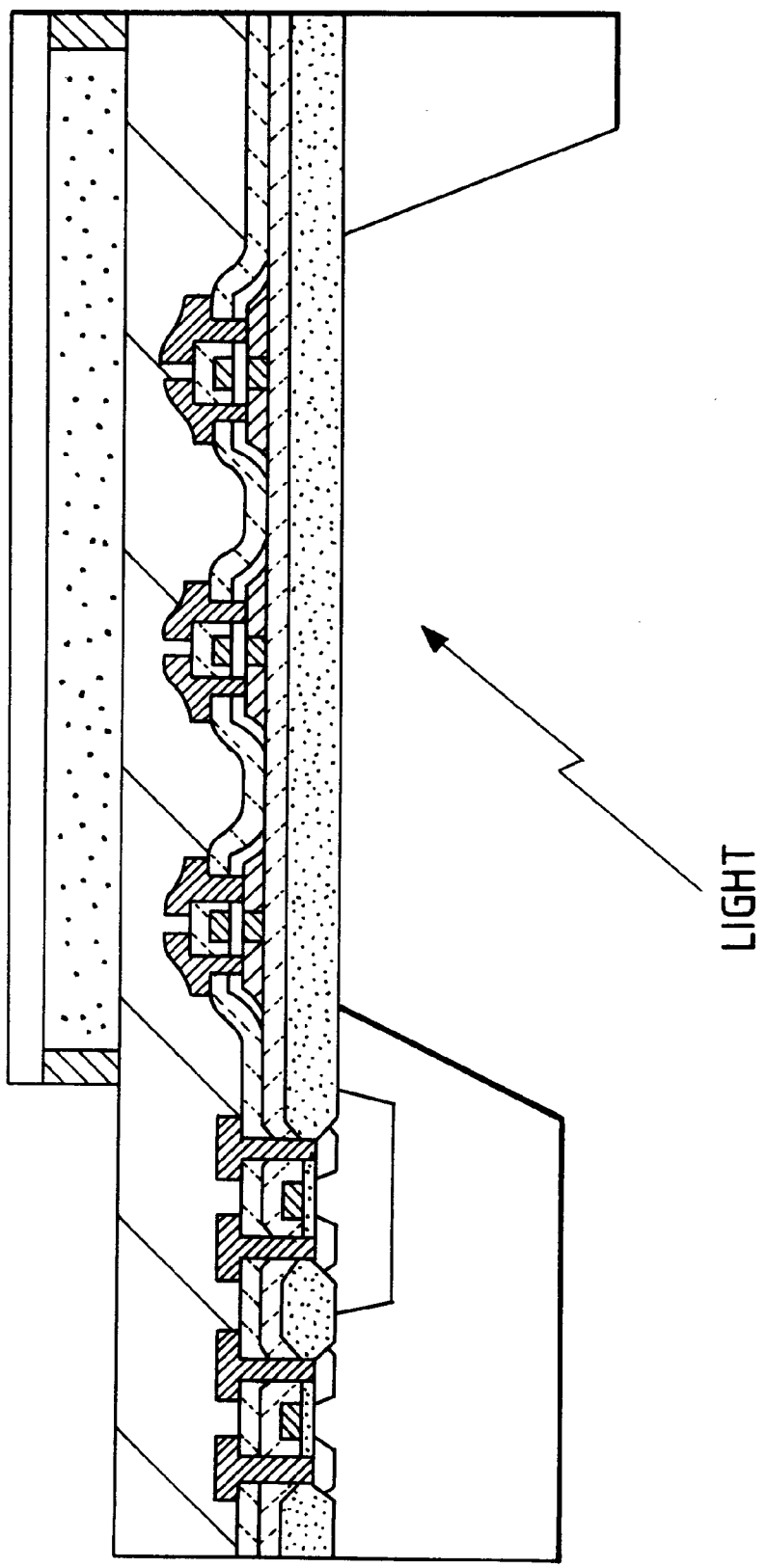

SEMICONDUCTOR DEVICE APPLICABLE FOR LIQUID CRYSTAL DISPLAY DEVICE, AND PROCESS FOR ITS FABRICATION

This application is a continuation of application Ser. No. 08/614,101, filed Mar. 12, 1996, now abandoned, which is, in turn, a continuation of application Ser. No. 08/172,103, filed Dec. 23, 1993, now abandoned.

BACKGROUND OF THE INVENTION

1. Field of the Invention

This invention relates to a semiconductor device, a semiconductor device applicable for a liquid crystal display device, and a process for fabricating the semiconductor device. More particularly, the present invention relates to a semiconductor device applicable for a liquid crystal display device, comprising a non-monocrystalline semiconductor element and a monocrystalline semiconductor element which are provided on the same substrate, and a process for fabricating such a semiconductor device.

2. Related Background Art

As prior art, semiconductor devices used for liquid crystal display devices will be first described.

Liquid crystal display devices provided with active matrix elements have been hitherto made commercially available as flat panel display devices or projection televisions.

FIG. 17 schematically illustrates the construction of a drive circuit for active matrix type liquid crystal display elements that has been conventionally used. In FIG. 17, reference numeral 301 denotes a picture element switch; 305, a liquid crystal picture element; 306, a transparent substrate; 302, a buffer portion; 303, a horizontal shift register; and 304, a vertical shift register. Luminance signals and sound signals of televisions are compressed in a certain band and are transferred to the buffer portion 302 that is driven by the horizontal shift register 303 having a driving capacity enough to be able to follow up the frequencies of the band. Next, the signals are transferred to the liquid crystal in the period in which the picture element switch 301 is kept "ON" by the vertical shift register 304.

Performance required for each circuit should be considered here. Assume that, taking account of high-grade televisions, they operate at a frame frequency of 60 Hz, a scanning line number of about 1,000 lines, a horizontal scanning period of about 30 $\mu$sec (effective scanning period: 27 $\mu$sec) and a horizontal picture element number of abut 1,500 elements, the television signals are transferred to the buffer at a frequency of about 45 MHz. Hence, each circuit is required to have the following performance:

(1) The horizontal shift register can drive at 45 MHz or above (i.e., driving capacity);
(2) the vertical shift register can drive at 500 kHz or above;
(3) a transfer switch that is driven by the horizontal shift register and transfers television signals to the buffer can drive at 45 MHz or above; and
(4) the picture element switch can drive at 500 kHz or above.

What is meant by the driving capacity herein referred to is that, when a liquid crystal picture element is made to have a certain gradation number N, a voltage not lower than the following voltage is transferred within the above period.

$$V_m - (V_m - V_t)/N [V]$$

wherein $V_m$ represents a voltage that gives a maximum or minimum transmittance of a liquid crystal, and $V_t$ represents a liquid-crystal threshold voltage obtained from a V-T (voltage-transmittance) curve.

As is seen from these, the picture element switch and the vertical shift register may have a relatively small driving capacity, but the horizontal shift register and the buffer portion are required to drive at a high speed. For this reason, in existing liquid crystal display devices, measures are taken such that the picture element switch and the vertical shift register are formed in a monolithic fashion together with liquid crystals, using polycrystalline silicon or amorphous silicon thin-film transistors (TFTs) deposited on a glass substrate; in other peripheral circuits, IC chips are externally packaged. Although it is attempted to form the peripheral circuits also in a monolithic fashion using polycrystalline silicon TFTs, transistors must be made larger in size or circuits must be complicatedly designed, because of a small driving capacity of individual TFTs. Meanwhile, as for liquid crystal imaging apparatus such as VTR camera viewfinders or projection display devices, it is important for the substrate to be light-transmissive in their visible light regions.

As stated above, peripheral drive circuits with high-performance liquid. Crystal picture elements are required in order to accomplish high-performance liquid crystal display devices, and a semiconductor layer on which semiconductor elements constituting them are formed should be formed of a semiconductor monocrystalline layer having a good crystallinity. Such peripheral drive circuits must be screened from light.

As for the active matrix element which orients a liquid crystal in accordance with a signal, it need not necessarily be formed by monocrystalline transistors, but transistors must be formed on a light-transmitting film.

An example will be given below. Assume that the total load of the active matrix element is 50 fF and the voltage swing width for liquid crystal orientation is 10 V, a charge of;

$$50 \times 10^{-15} \times 10 = 5 \times 10^{-13} \tag{C}$$

must be flowed in a given time. When it is taken into account to drive this element at 500 kHz as stated above, the saturated current required for the transistors is;

$$I_{sat} \times 1/(500 \times 10^3) > 5 \times 10^{-13}$$

and is;

$$I_{sat} > 2.5 \times 10^{-7} \tag{A}$$

Thus, it is seen to be enough for the saturated current to be 250 nA or more. This is a value that can be well achieved by the polycrystalline silicon or amorphous silicon thin-film transistors.

Items required in the peripheral drive circuit elements and the active matrix elements can be summarized as shown in Table 1.

TABLE 1

| Peripheral drive circuit element | Active matrix element |
| --- | --- |
| Current driving capacity: | |
| Comparable to monocrystalline element | Higher than polycrystalline or amorphous element |
| Light transmission properties of substrate: | |
| Unnecessary | Necessary |

In instances in which both the driving capacity comparable to monocrystalline elements and the light transmission properties of substrates are required in elements, a monocrystalline SOI (silicon on insulator) must be used. In the case of liquid crystal display devices, however, there is no element in which both of the above two items of performance are required, and hence one may have an idea of a constitution in which the peripheral drive circuit element and the active matrix element are separately built in.

If, however, the peripheral drive circuit element and the active matrix element are built in separate substrates, it becomes necessary to connect the both by wire bonding or the like, which results in a complicated process. Thus, it has been sought to make an improvement so that a cost decrease can be achieved and picture elements can be made much finer.

SUMMARY OF THE INVENTION

An object of the present invention is to provide a semiconductor device and a liquid crystal display device that enable fabrication of an element required to have a performance comparable to that of a monocrystalline element and an element required to be formed on a light-transmitting substrate, on the same substrate by a simple process.

To achieve the above object, the present invention provides a semiconductor device comprising;

- a substrate comprising a semiconductor monocrystalline substrate on one principal surface side of which a light-transmitting film is formed; the substrate being prepared by removing from the other principal surface side thereof a semiconductor monocrystalline region present right beneath the light-transmitting film;
- a non-monocrystalline semiconductor element formed on the light-transmitting film; and
- a monocrystalline semiconductor element formed in a semiconductor monocrystalline region remaining in the substrate;
- the non-monocrystalline semiconductor element and the monocrystalline semiconductor element being electrically connected.

The present invention also provides a process for fabricating the semiconductor device described above.

BRIEF DESCRIPTION OF THE DRAWINGS

FIG. 1 is a diagrammatic cross section to illustrate an example of the liquid crystal display device of the present invention.

FIG. 2 is a cross section to illustrate a fabrication step in an embodiment of the liquid crystal display device of the present invention.

FIG. 3 is a cross section to illustrate a fabrication step in an embodiment of the liquid crystal display device of the present invention.

FIG. 4 is a cross section to illustrate a fabrication step in an embodiment of the liquid crystal display device of the present invention.

FIG. 7 is a cross section to illustrate a fabrication step in an embodiment of the liquid crystal display device of the present invention.

DESCRIPTION OF THE PREFERRED EMBODIMENTS

Figure 5:
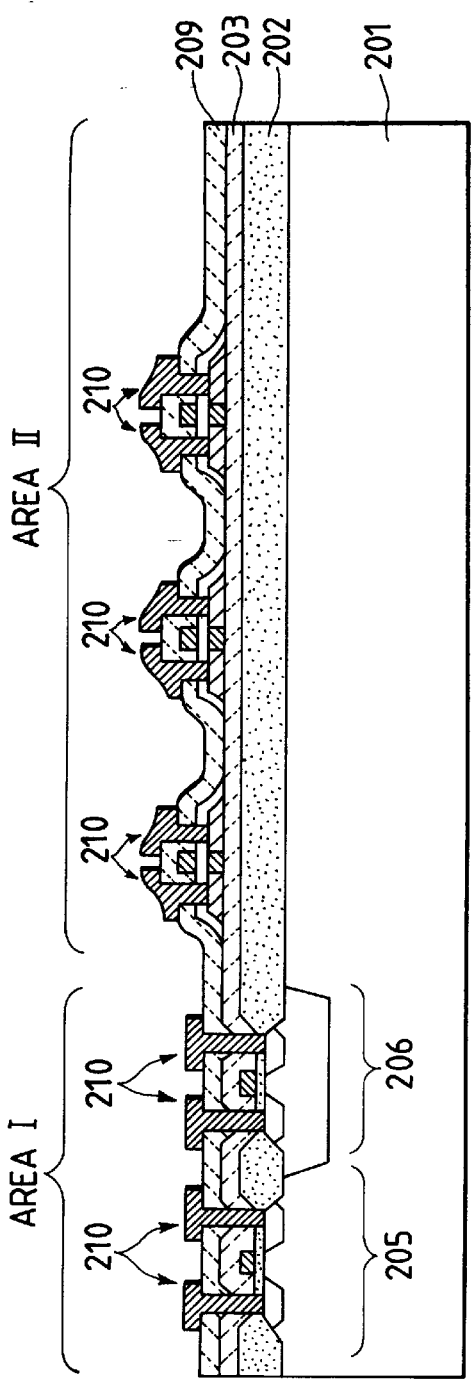
FIG. 5 is a cross section to illustrate a fabrication step in an embodiment of the liquid crystal display device of the present invention.
Figure 6:
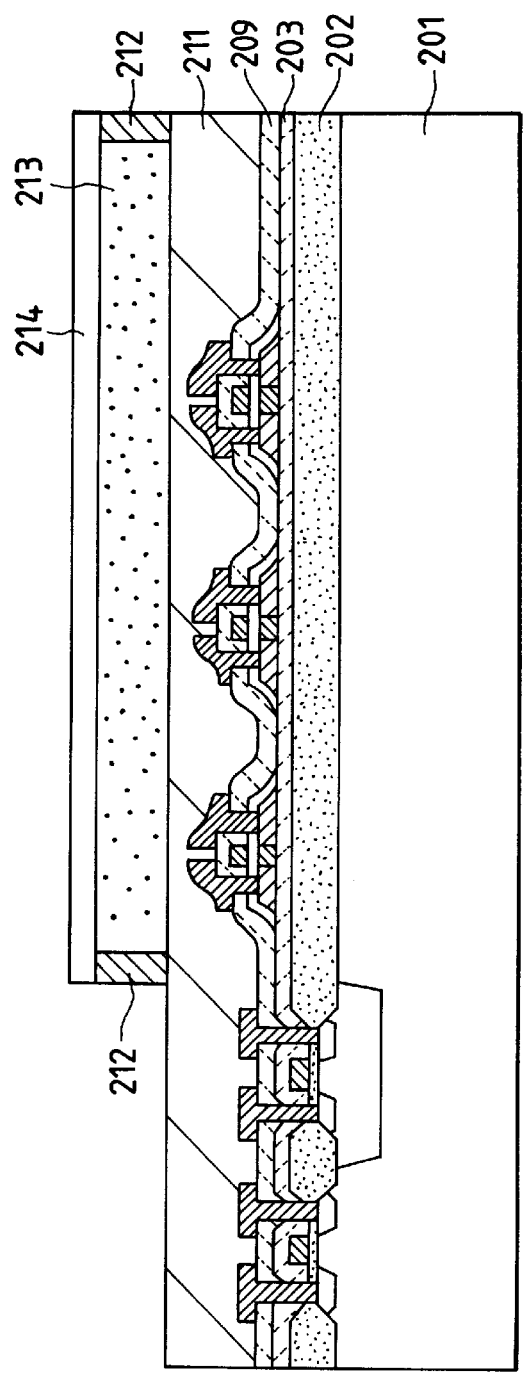
FIG. 6 is a cross section to illustrate a fabrication step in an embodiment of the liquid crystal display device of the present invention.

The semiconductor device of the present invention is constituted as described below. That is, the semiconductor device of the present invention is characterized by having;

- a substrate comprising a semiconductor monocrystalline substrate on one principal surface side of which a light-transmitting film is formed; the substrate being prepared by removing from the other side principal surface thereof a semiconductor monocrystalline region present right beneath the light-transmitting film;
- a non-monocrystalline semiconductor element formed on the light-transmitting film; and
- a monocrystalline semiconductor element formed in a semiconductor monocrystalline region remaining in the substrate;
- the non-monocrystalline semiconductor element and the monocrystalline semiconductor element being electrically connected.

The liquid crystal display device of the present invention is characterized by having;

a substrate comprising a semiconductor monocrystalline substrate on one principal surface side of which a light-transmitting film is formed; the substrate being prepared by removing from the other side principal surface thereof a semiconductor monocrystalline region present right beneath the light-transmitting film;

an active matrix element formed on the light-transmitting film; and a drive circuit formed in a semiconductor monocrystalline region remaining in the substrate;

the active matrix element and the drive circuit being electrically connected.

The present invention also includes a process for fabricating the semiconductor device.

The process for fabricating the semiconductor device comprises the steps of;

forming an electric circuit on part of one principal surface of a semiconductor monocrystalline substrate, while forming an oxide film on another part of the principal surface and then forming a semiconductor element on the oxide film;

wiring the electric circuit and the semiconductor element and electrically connecting them;

forming an insulating film on the electric circuit and the semiconductor element;

sealing a liquid crystal between a light-transmitting substrate different from the semiconductor monocrystalline substrate and the insulating film by the use of a sealing material; and etching the monocrystalline substrate to remove part thereof from its back surface of the one principal surface.

The present invention employs a substrate comprised of a portion constituted of a light-transmitting film having light transmission properties and another portion constituted of a semiconductor monocrystalline region, which substrate comprises a semiconductor monocrystalline substrate on one principal surface side of which a light-transmitting film is formed and is prepared by removing from the other side principal surface thereof a semiconductor monocrystalline region present right beneath the light-transmitting film. The light-transmitting film on this substrate is provided with a semiconductor element as exemplified by a thin film transistor not required to have a performance comparable to that of a monocrystal, and the semiconductor monocrystalline region of the substrate is provided with a monocrystalline semiconductor element. This makes it possible to integrally form on the same substrate the semiconductor element (not required to have a performance comparable to that of a monocrystal) that must be formed on a light-transmitting substrate and the semiconductor element required to have a high performance.

According to the present invention, as described above, the semiconductor element that must be formed on a light-transmitting substrate and the semiconductor element required to have a high performance can be integrally formed on the same substrate, and hence the respective semiconductor elements can be electrically connected without fabricating them on the respectively different substrates and wiring them through mechanical connection such as wire bonding (i.e, they can be connected by Al wiring according to conventional deposition techniques).

In the present invention, the circuit required to have a high performance can be provided on the semiconductor monocrystalline substrate so as to be constituted of a monocrystalline element. Hence, there may occur no problems such that the device must be made larger in size when such circuit is constituted of a non-monocrystalline material and the circuit must be complicatedly designed (e.g., block-divided driving).

The present invention can be preferably used in active matrix type liquid crystal display devices. More specifically, the active matrix type liquid crystal display devices are required to provide active matrix elements such as thin film diodes and thin film transistors on a light-transmitting substrate and to form drive circuits such as shift registers as monocrystalline elements. However, employment of the present invention makes it possible to integrally form the active matrix elements and drive circuits on the same substrate and also to electrically connect them without wiring by mechanical connection such as wire bonding.

The present invention will be described in detail by giving Examples with reference to the accompanying drawings.

EXAMPLE 1

The semiconductor device of the present invention can be preferably used for a liquid crystal display device having a liquid crystal element serving as an optical element, a photosenser having a photoelectric transducer serving as an optical element, and so forth. In particular, it is characterized in the substrate on which a semiconductor element preferably usable in an optical element is formed.

To make it easy to understand the present invention, the semiconductor device according to the present invention will be described below with reference to FIG. 1. FIG. 1 is a diagrammatic cross section to illustrate an example of the liquid crystal display device which is an example of the semiconductor device of the present invention.

A substrate 100 is provided thereon with a light non-transmitting area 1 and a light-transmitting area 2. The light non-transmitting area 1 is provided therein with at least one semiconductor element 3 containing a monocrystalline semiconductor layer as an active region. Meanwhile, the light-transmitting area 2 is provided thereon with at least one semiconductor element 4 containing a non-monocrystalline semiconductor layer as an active region. To set up a liquid crystal display device, an aligning film 8 is further provided on the light-transmitting area 2, and a cover glass 7 serving as an opposing substrate is provided thereon. The space formed between them is fill with a liquid crystal 5 and its periphery is sealed with a sealing member 6. As the semiconductor element used here in the present invention, three-terminal elements such as bipolar transistors and MOS transistors or two-terminal elements such as diodes are preferably used.

The light non-transmitting area 1 may preferably be comprised of a monocrystalline semiconductor, and can be readily made light non-transmissive by controlling its thickness or providing a light screening layer.

As for the light-transmitting area 2, an insulating thin film is preferably used. Stated specifically, it is a single layer or multiple layer formed of silicon oxide or silicon nitride. The non-monocrystalline semiconductor used in the semiconductor element provided thereon may be those having a crystal structure such as a polycrystalline, microcrystalline or amorphous structure. These can be readily formed as thin films by chemical vapor deposition (CVD), physical vapor deposition (PVD) or the like.

The semiconductor element 4 may preferably be used as a picture element switch. As for the semiconductor element 3, it is used to constitute a peripheral drive circuit such as a drive circuit for driving the semiconductor element 4.

Meanwhile, when the photoelectric transducer is used as an optical element, the non-monocrystalline semiconductor layer may be made to serve as a photoelectric conversion portion or an active region of a switching transistor on the light-transmitting area 2.

As the substrate 100 used in the present invention, it is preferable to use a substrate obtained by forming a light-transmitting insulating film on a substrate comprised of a monocrystalline semiconductor, and thereafter selectively removing the substrate at its portion to be made light-transmissive.

More preferably, the light-transmitting area is simultaneously formed when an element separating region for forming a semiconductor element in the light non-transmitting area is formed. Stated specifically, a relatively thick oxide film is formed by selective oxidation.

Thus, because of substantial agreement in the level of the surfaces on the light non-transmitting area 1 and light-transmitting area 2, the wiring between elements can be carried out with ease by a conventional process.

A process for producing the above liquid crystal display device will be described below with reference to FIGS. 2 to 7.

First, a silicon wafer 201 having a (100) plane on its principal surface is made ready. A peripheral drive circuit is formed in CMOS construction by a known technique, a monocrystalline wafer semiconductor process. At this time, a liquid crystal picture element display portion is covered with a field oxide film (serving as a light-transmitting film) 202. In the present Example, the field oxide film 202 is set in a thickness of 1 μm. In both an n-MOS transistor 206 and a p-MOS transistor 205, polycrystalline silicon is used as gate materials, and they are each set in a thickness of 4,000 Å. A source and a drain are formed in a self alignment fashion by ion implantation. In the n-MOS transistor 206 and the p-MOS transistor 205, As and $BF_2$ are implanted at doses of $1 \times 10^{16}/cm^2$ and $2 \times 10^{15}/cm^2$ respectively.

After the impurity ions have been implanted in the source and drain portions, NSG (non-doped silicate glass) 203 is deposited by normal pressure CVD in a thickness of about 2,000 Å. Next, polycrystalline silicon 204 is deposited by low pressure CVD in a thickness of about 2,500 Å. Then, boron is ion-implanted at a dose of of $1 \times 10^{11}/cm^2$ over the whole surface (see FIG. 2).

Next, on the portion where an active matrix element is to be formed, a resist pattern is left in the form of islands by photolithography. Using the resist as a mask, polycrystalline silicon regions 204 are formed at given positions by isotropic dry etching. Thereafter, an oxide film 207 of 500 Å thick is made to grow on each polycrystalline silicon region 204 by pyrogenic oxidation at 950° C. These serve as gate oxide films of thin-film transistors (see FIG. 3).

Next, polycrystalline silicon is over again deposited by low pressure CVD, and gate electrodes 208 of the thin-film transistors are formed by anisotropic etching. Thereafter, the peripheral drive circuit portion is masked with a resist, and arsenic is ion-implanted at a dose of about $5 \times 10^{15}/cm^2$. Then, heat treatment is applied in a nitrogen atmosphere at 900° C. for 20 minutes to form the thin-film transistors (see FIG. 4.)

Next, NSG 209 is again deposited in a thickness of about 5,000 Å by normal pressure CVD, and contact holes are made in the source and drain regions and gate electrode regions of the transistors.

In that instance, because of a difference between the thickness 7,000 Å of the interlayer insulating films (203 and 209) in the peripheral drive circuit area (area I) and the thickness 5,000 Å of the interlayer insulating film 209 in the active matrix element area (area II), it is safer from the viewpoint of a process to make contact holes separately in the area I and in the area II. In practice, however, $CHF_3$—$C_2F_6$ type dry etching caused no trouble at all even when all the contact holes were made together.

Thereafter, an electrode material such as aluminum is deposited by sputtering, and is worked into a given wiring form by dry etching to form wirings 210 (see FIG. 5).

Next, using a transparent electrode material such as ITO known in the art, a capacitor portion is formed to cover the whole surface with a transparent insulating film 211. Thereafter, a sealing member 212 and a glass cover 214 are attached to seal a liquid crystal 213 (see FIG. 6).

Finally, using a wet etching solution comprising KOH or an organic alkali such as ethylenediamine, silicon is removed from the silicon substrate 201 so as to be hollowed out at its given area on the back surface. In that instance, the wet etching solution does not dissolve silicon dioxide, and hence the etching stops at the field oxide film 202. As a result, the active matrix element area becomes transparent and comes to be functionable as a liquid crystal image display device (see FIG. 7).

An embodiment according to the present invention has been described above in detail. A modification as shown below is also possible.

That is, the above active matrix element makes use of an n-channel type MOSFET, and it may alternatively make use of a p-channel type MOSFET.

The peripheral drive circuit, constituted of a CMOS circuit in the above, may alternatively be constituted of a Bi-CMOS circuit containing a bipolar transistor, taking account of an improvement in driving capacity.

For the purpose of decreasing steps, the following fabrication process is also possible.

The NSG film 203 shown in FIG. 2 is omitted, and the gate electrode portions of the n-MOS transistor 206 and p-MOS transistor 205 are beforehand thermally oxidized in a thickness of 300 Å. At this time, none of impurities of the source and drain regions have been implanted in both the p-MOS transistor 206 and the p-MOS transistor 205. After the source/drain regions of the thin-film transistors have been formed, the peripheral drive circuit portion and the source/drain regions of the thin film transistors are simultaneously formed. The subsequent steps are the same as the fabrication steps described above.

Whether or not the steps can be shortened in this way depends on whether or not the selectivity to silicon dioxide can be highly assured when the second polycrystalline silicon layers 204 are subjected to dry etching. This can be well accomplished by means of an existing dry etching apparatus making use of $CF_4$.

EXAMPLE 2

In order to prevent wrinkles from occurring on a thin-film portion remaining after etching, and taking account of film thickness of films formed layer by layer and a stress produced when a single layer is formed, the semiconductor device of the present invention includes a device provided with a layer capable of controlling the stress on the whole multiple layers (a stress controlling layer), or provided with a layer capable of playing roles as the stress controlling layer and as an insulating layer used when a semiconductor integrated circuit is fabricated.

In the device thus constituted, the stress produced in the substrate when a non-transparent portion under the insulating layer is removed by etching acts as a tensile stress because of the multi-layer film structure containing the stress controlling layer, and hence the multi-layer film where the semiconductor integrated circuit has been built in can be prevented from wrinkling.

An example thereof will be described with reference to FIGS. 8A and 8B.

Figure 8A:
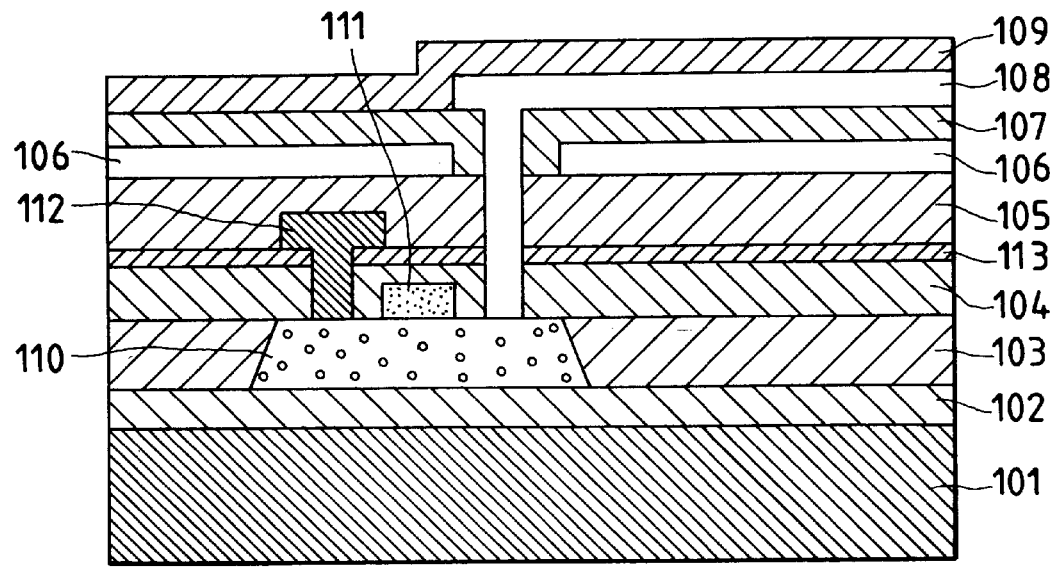
FIGS. 8A and 8B are diagrammatic cross sections to illustrate a construction and fabrication steps of a light transmission type semiconductor device according to the present invention.
Figure 8B:
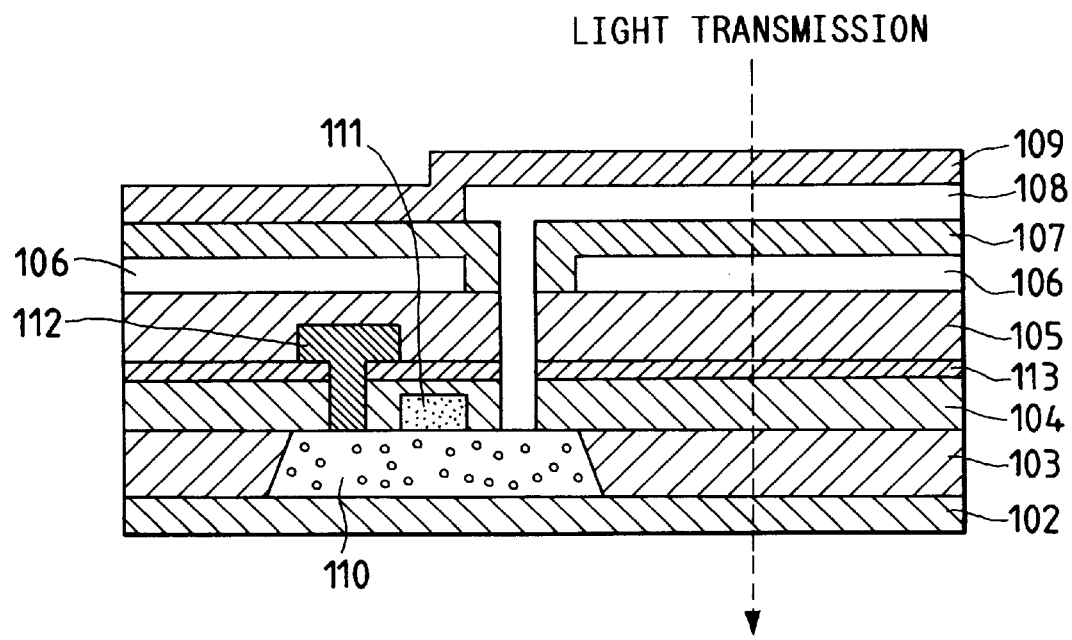

FIGS. 8A and 8B are diagrammatic cross sections to illustrate a multi-layer film structure of a light transmission type semiconductor integrated circuit built in a monocrystalline silicon thin film on an insulating layer. FIGS. 8A and 8B also illustrate fabrication steps of a semiconductor device for liquid crystal driving, where FIG. 8A shows a constitution in which the display area has not been made transparent, and FIG. 8B, a structure in which it has been made transparent by etching away the substrate 101.

In the drawings, reference numeral 101 denotes an Si substrate; 102 and 103, $SiO_2$ layers; and 110, an active region in which a liquid crystal driving MOS transistor is formed. The $SiO_2$ layer 102 should preferably have a layer thickness of about 400 nm, and the $SiO_2$ layer 103 should preferably have a layer thickness of about 1,100 nm. Reference numeral 104 denotes an LP-SiNx film (SiNx film formed by low-pressure gas phase synthesis) serving as the stress controlling layer according to the present Example; 105, an interlayer insulating film; 112, Al wiring; and 111, polysilicon gate wiring. Reference numeral 113 denotes a BPSG film provided to increase smoothness and insulating properties; 106 and 108, ITO films that hold between them a PSG film 107 or an SiNx film (a p-SiNx film) formed by plasma CVD, to form a liquid crystal holding capacitor. Reference numeral 109 denotes a passivation film, formed of p-SiNx, PSG, polyimide or the like.

In the present Example, the LP-SiNx film 104 serves as the stress controlling layer of the whole multi-layer film where the semiconductor integrated circuit has been built in. It should preferably have a film thickness of about 600 nm.

Each film was formed by using known techniques for fabricating semiconductor integrated circuits.

Next, after a black matrix and a color filter were formed on a cover glass, common electrodes were formed, followed by orientation treatment. The substrate on which the semiconductor integrated circuit had been formed was subjected to orientation, and a sealing material was printed. Thereafter, the cover glass and the substrate on which the semiconductor integrated circuit had been formed were put together and liquid crystal was injected into the space between them. To the steps concerning this liquid crystal, known techniques for producing liquid crystal display devices were applied.

Thereafter, the silicon substrate was covered with a base-resistant rubber except its portion right beneath the liquid crystal image display area, and the silicon substrate 101 was partially removed until the insulating film 102 was laid bare, using a tetramethylammonium hydroxdie (TMAH) solution. In order to improve reliability, the recess in the substrate formed by the partial removal was filled with a transparent resin to make the device light-transmissive. Thus, a projection type liquid crystal image display device was completed.

Figure 12:
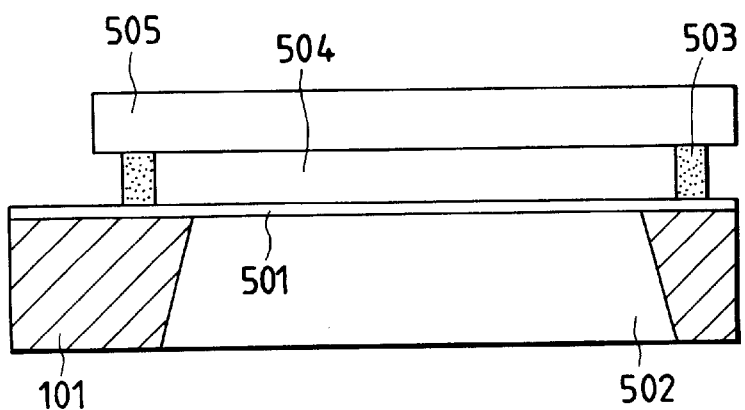
FIG. 12 is a diagrammatic illustration of an example of the liquid crystal display device according to the present invention.

FIG. 12 illustrates the liquid crystal image display device according to the present Example, thus produced. In the drawing, reference numeral 101 denotes a silicon substrate; 501, a liquid crystal driving element layer; 502, a transparent resin; 503, an adhesive; 504, a liquid crystal; and 505, a cover glass.

Figure 11:
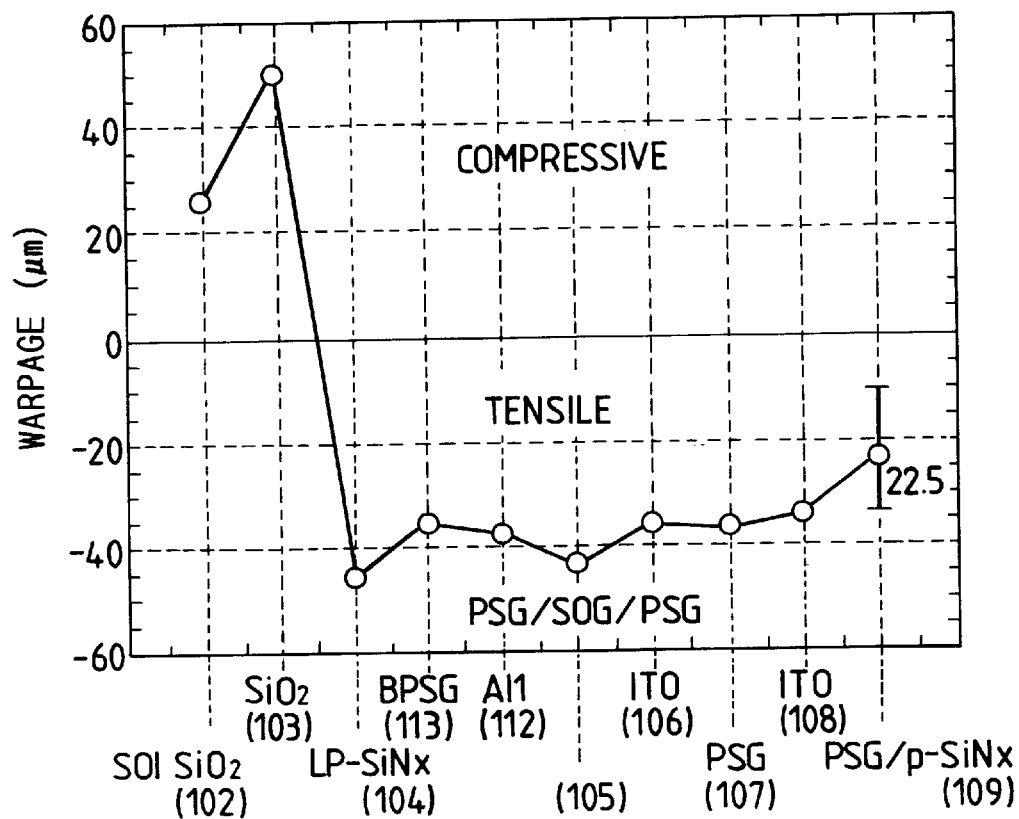
FIG. 11 is a graph to show a warpage of a substrate when films are multi-layered thereon.

FIG. 11 is a graph to show how the stress changes as the respective layers of the multi-layer film having been made transparent in the above constitution are formed layer by layer, where the stress is shown by calculating it as a warpage of the wafer.

Most films formed in multiple layers are films with compressive stress that cause wrinkles. However, the LP-SiNx film 104 is seen to have converted the stress of the whole multi-layer film into tensile stress, showing that the LP-SiNx film 104 as the stress controlling layer according to the present invention effectively acts.

Table 2 also shows the stress produced in the multi-layer film when the layer thickness of the LP-SiNx film 104 was changed to range from 0 to 800 nm, where the stress is shown by calculating it as a warpage of the wafer. When the stress of the whole multi-layer film, calculated as a warpage of the wafer, was in a tensile stress of from 0 to 100 $\mu$m, the removal of the silicon substrate 101 up to the bottom of the $SiO_2$ layer 102 by etching made the semiconductor integrated circuit area on the upper part of the $SiO_2$ film 102 transparent and then brought about the achievement of a uniform plane usable as that of a liquid crystal display device. When, however, the stress of the whole multi-layer film was on the side of compressive stress, the film became wrinkled, or when the stress of the whole multi-layer film, calculated as a warpage of the wafer, was in a tensile stress of more than 100 $\mu$m, the film cracked because of an excessive tensile stress.

TABLE 2

Relationship between a warpage of 5"-Si (100) wafer and the state of the film

| Thickness of LP-SiNx film 104 | Warpage ($\mu$m) | Direction of stress | State of the film |
| --- | --- | --- | --- |
| 0 nm | +10 $\mu$m | Compressive | Wrinkled |
| 100 nm | 0 $\mu$m | — | Tensed |
| 400 nm | −30 $\mu$m | Tensile | Tensed |
| 600 nm | −100 $\mu$m | Tensile | Tensed |
| 800 nm | <−100 $\mu$m | Tensile | Broken |

EXAMPLE 3

Figure 9A:
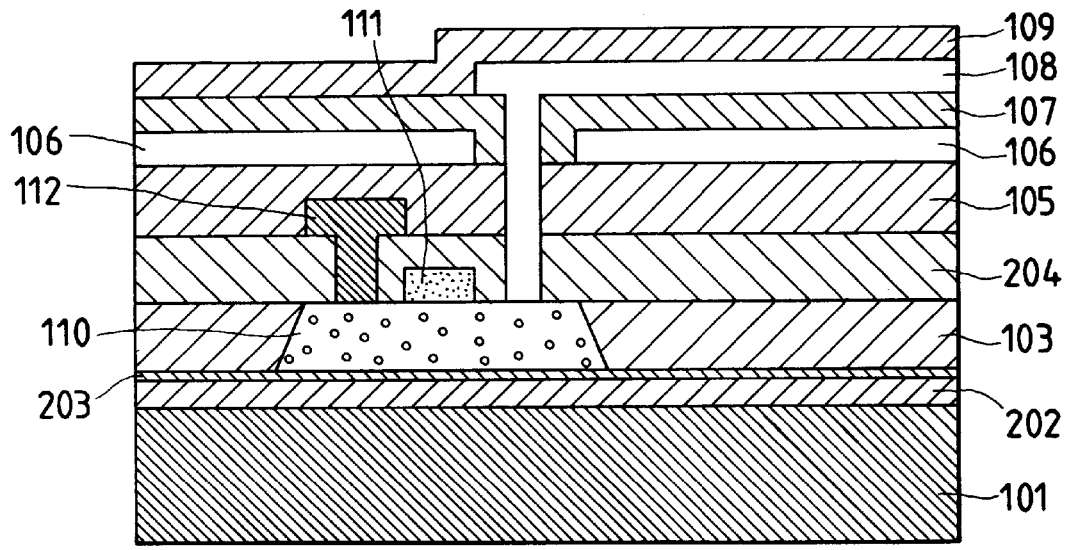
FIGS. 9A and 9B are diagrammatic cross sections to illustrate a construction and fabrication steps of a light transmission type semiconductor device according to the present invention.
Figure 9B:
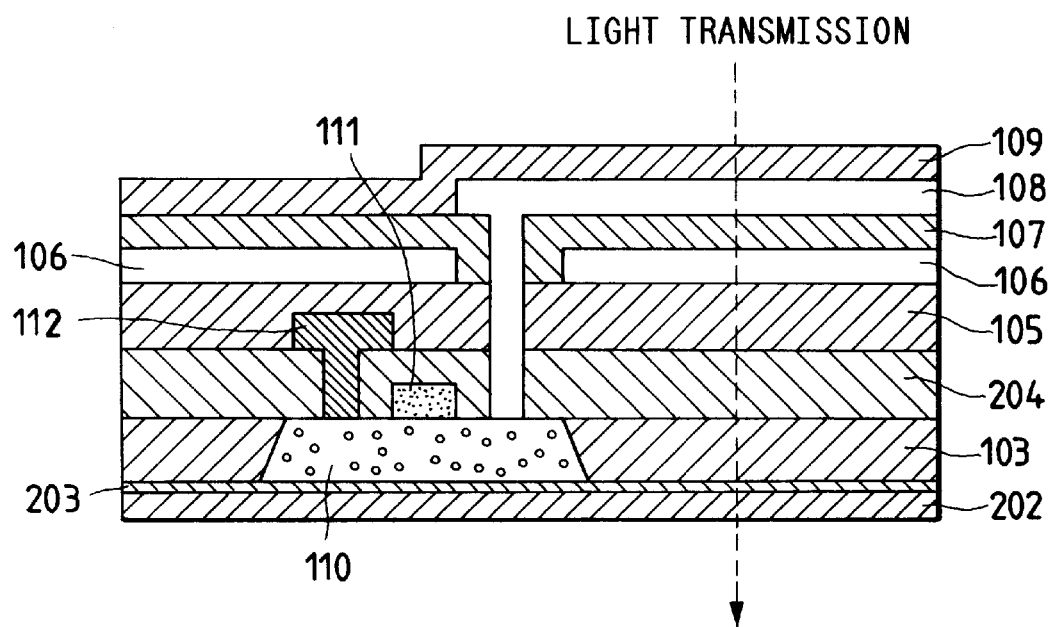

FIGS. 9A and 9B illustrate another example of the semiconductor device for liquid crystal driving of the present invention, where FIG. 9A shows a constitution in which the display area has not been made transparent, and FIG. 9B, a structure in which it has been made transparent by etching away the substrate 101.

In the drawings, reference numeral 101 a silicon substrate; and 202, an LP-SiNx film.

In the present Example, the LP-SiNx layer 202 serves as the stress controlling layer of the whole multi-layer film where a semiconductor integrated circuit has been built in. It should preferably have a layer thickness of from about 200 to about 400 nm. An $SiO_2$ layer 203 may be provided so that the active layer can be made stable.

Reference numeral 103 denotes an $SiO_2$ layer. The $SiO_2$ layer should preferably have a layer thickness of about 1,100 nm. Reference numeral 110 denotes an active region in which an MOS transistor for liquid crystal driving is formed. Reference numeral 204 denotes an interlayer insulating film for Al wiring 112 and polysilicon gate wiring 111. Reference numeral 203 denotes a BPSG film provided to increase smoothness and insulating properties. ITO films denoted by reference numerals 106 and 108 hold between them a PSG film 107 or a p-SiNx film to form a liquid crystal holding capacitor. Reference numeral 109 denotes a passivation film, formed of p-SiNx, PSG, polyimide or the like.

Each film was formed by using known techniques for fabricating semiconductor integrated circuits.

Next, after a black matrix and a color filter were formed on a cover glass, common electrodes were formed, followed by orientation. The substrate on which the semiconductor integrated circuit had been formed was subjected to orientation, and a sealing material was printed. Thereafter, the both were put together and liquid crystal was injected into the space between them. To the steps concerning this liquid crystal, known techniques for producing liquid crystal display devices were applied.

Thereafter, the silicon substrate was covered with a base-resistant rubber except its portion right beneath the liquid crystal image display area, and the silicon substrate 101 was partially removed until the insulating film 102 was laid bare, using a tetramethylammonium hydroxdie (TMAH) solution. In order to improve reliability, the recess in the substrate formed by the partial removal was filled with a transparent resin to make the device light-transmissive. Thus, a projection type liquid crystal image display device was completed.

When the stress of the whole multi-layer film, calculated as a warpage of the wafer, was in a tensile stress of from 0 to 100 $\mu$m, the removal of the silicon substrate 101 up to the bottom of the LP-SiNx layer 202 by etching made the semiconductor integrated circuit area on the upper part of the LP-SiNx layer 202 transparent and then brought about the achievement of a uniform plane usable as that of a liquid crystal display device. When, however, the stress of the whole multi-layer film was on the side of compressive stress, the film became wrinkled, or when the stress of the whole multi-layer film, calculated as a warpage of the wafer, was in a tensile stress of more than 100 $\mu$m, the film cracked because of an excessive tensile stress.

EXAMPLE 4

Figure 10A:
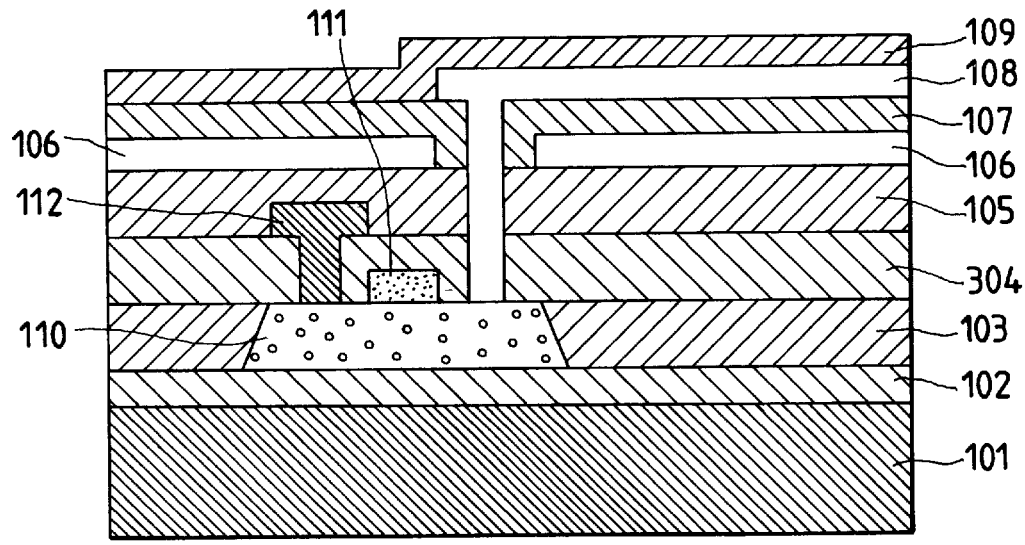
FIGS. 10A and 10B are diagrammatic cross sections to illustrate a construction and fabrication steps of a light transmission type semiconductor device according to the present invention.
Figure 10B:
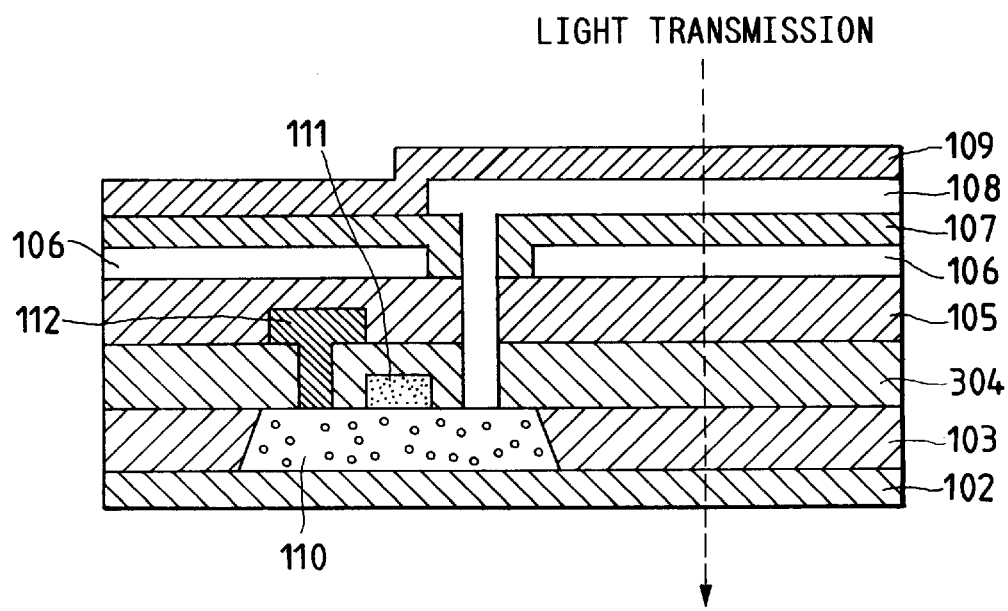

FIGS. 10A and 10B illustrate still another example of the semiconductor device for liquid crystal driving of the present invention, where FIG. 10A shows a constitution in which the display area has not been made transparent, and FIG. 10B, a structure in which it has been made transparent by etching away the substrate 101.

In the drawings, reference numeral 101 denotes an Si substrate; 102 and 103, $SiO_2$ layers; and 110, an active region in which a liquid crystal driving MOS transistor is formed. The layer 102 should preferably have a layer thickness of about 400 nm, and the layer 103 should preferably have a layer thickness of about 1,100 nm. Reference numeral 304 denotes an interlayer insulating film for Al wiring 112 and polysilicon gate wiring 111.

In the present Example, the interlayer insulating film 304 serves as the stress controlling layer of the whole multi-layer film where a semiconductor integrated circuit has been built in. The interlayer insulating film 304 is comprised of a silicon oxide film formed by gas phase synthesis using TEOS as a starting material gas, and should preferably have a layer thickness of about 1 $\mu$m.

ITO films denoted by reference numerals 106 and 108 hold between them a PSG film or p-SiNx film 107 to form a liquid crystal holding capacitor. Reference numeral 109 denotes a passivation film, formed of p-SiNx, PSG, polyimide or the like.

Each film was formed by using known techniques for fabricating semiconductor integrated circuits.

Next, after a black matrix and a color filter were formed on a cover glass, common electrodes were formed, followed by orientation. The substrate on which the semiconductor integrated circuit had been formed was subjected to orientation, and a sealing material was printed. Thereafter, the both were put together and liquid crystal was injected into the space between them. To the steps concerning this liquid crystal, known techniques for producing liquid crystal display devices were applied.

Thereafter, the silicon substrate was covered with a base-resistant rubber except its portion right beneath the liquid crystal image display area, and the silicon substrate 101 was partially removed until the insulating film 102 was laid bare, using a tetramethylammonium hydroxdie (TMAH) solution. In order to improve reliability, the recess in the substrate formed by the partial removal was filled with a transparent resin to make the device transparent. Thus, a light-transmitting, projection type liquid crystal display device was completed.

When the stress of the whole multi-layer film, calculated as a warpage of the wafer, was in a tensile stress of from 0 to 100 $\mu$m, the removal of the silicon substrate 101 up to the bottom of the $SiO_2$ layer 102 by etching made the semiconductor integrated circuit area on the upper part of the $SiO_2$ layer 102 transparent and then brought about the achievement of a uniform plane usable as that of a liquid crystal display device.

When, however, the stress of the whole multi-layer film was on the side of compressive stress, the film became wrinkled, or when the stress of the whole multi-layer film, calculated as a warpage of the wafer, was in a tensile stress of more than 100 $\mu$m, the film cracked because of an excessive tensile stress.

As shown in the above Examples, a tensile-stressed film like the LP-SiNx film is provided in the multi-layer film so that the stress in the whole multi-layer film can be controlled. This makes it possible to prevent the wrinkles or cracks due to internal stress from occurring even when the lower part silicon substrate is removed. As a result, a high-quality, light transmission type semiconductor device using monocrystals in the device can be accomplished.

The semiconductor device of the present invention also includes a semiconductor device comprising a substrate comprised of a monocrystalline substrate on one principal surface side of which a diffusion layer having a conductivity type reverse to the conductivity type of the monocrystalline substrate is formed; the monocrystalline substrate being selectively removed on its side opposite to the principal surface. Such a substrate is shown in FIG. 13.

Figure 13:
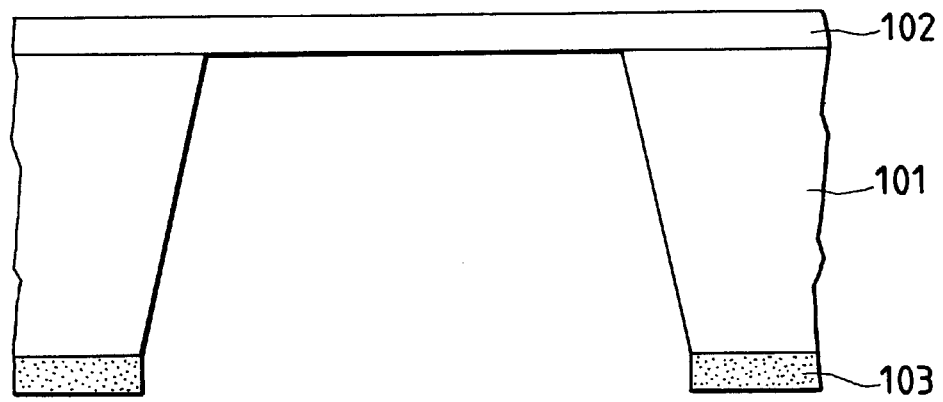
FIG. 13 is a diagrammatic cross section of a semiconductor substrate applicable in the semiconductor device of the present invention.

In FIG. 13, reference numeral 101 denotes a silicon substrate; 102, a diffusion layer; and 103, a thermal oxide film serving as a mask material. In this example, a thin diffusion layer 102 supported on a relatively thick silicon substrate 101 is formed on a hollow groove. Not shown in FIG. 13, an insulating layer may be formed beneath the diffusion layer 102 at its part fronting the groove, whereby a semiconductor substrate of an SOI structure can be readily obtained.

A process for preparing such an SOI substrate will be described in Example 5.

EXAMPLE 5

Figure 14A:
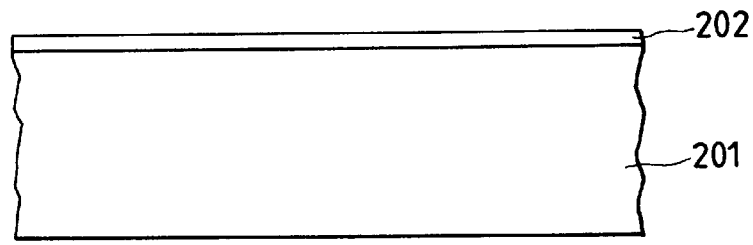
FIGS. 14A to 14D are diagrammatic cross sections of steps, to illustrate a fabrication process of a semiconductor substrate applicable in the semiconductor device of the present invention.

A p-type silicon monocrystalline substrate 201 with a specific resistance of from about 20 to 30 $\Omega$·cm was made ready. This substrate was oxided to a 500 Å thickness (FIG. 14A).

Figure 14B:
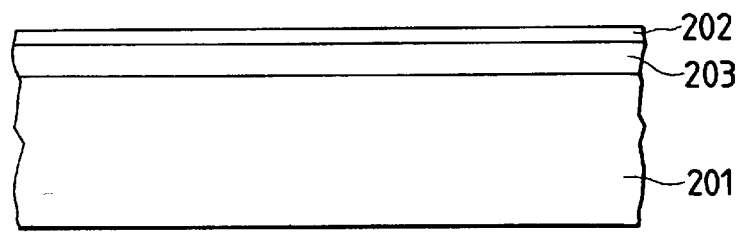

Next, P$^+$ is ion-implanted under conditions of $1\times10^{11}$ to $10^{14}$ cm$^{-2}$/60 to 100 keV. Thereafter, heat treatment is applied at 1,000° C. for 1 hour in an environment of N$_2$ to form an n-type diffusion layer 203. The diffusion layer has a depth of about 5,000 Å (FIG. 14B).

Next, an Si$_3$N$_4$ film 204 is formed as a mask material. Though variable depending on conditions for the etching of Si, a silicon wafer of 5 inch diameter and 625 μm thick can be well etched when the Si$_3$N$_4$ film is formed in a thickness of about 200 Å, since, if KOH (80° C.) is used, Si is etched at a rate of 12,000 Å/min and Si$_3$N$_4$ film is etched at a rate of 0.5 Å/min.

Next, a resist mask is applied and the Si$_3$N$_4$ film 204 at its desired place and the SiO$_2$ film 202 are etched away.

Figure 15:
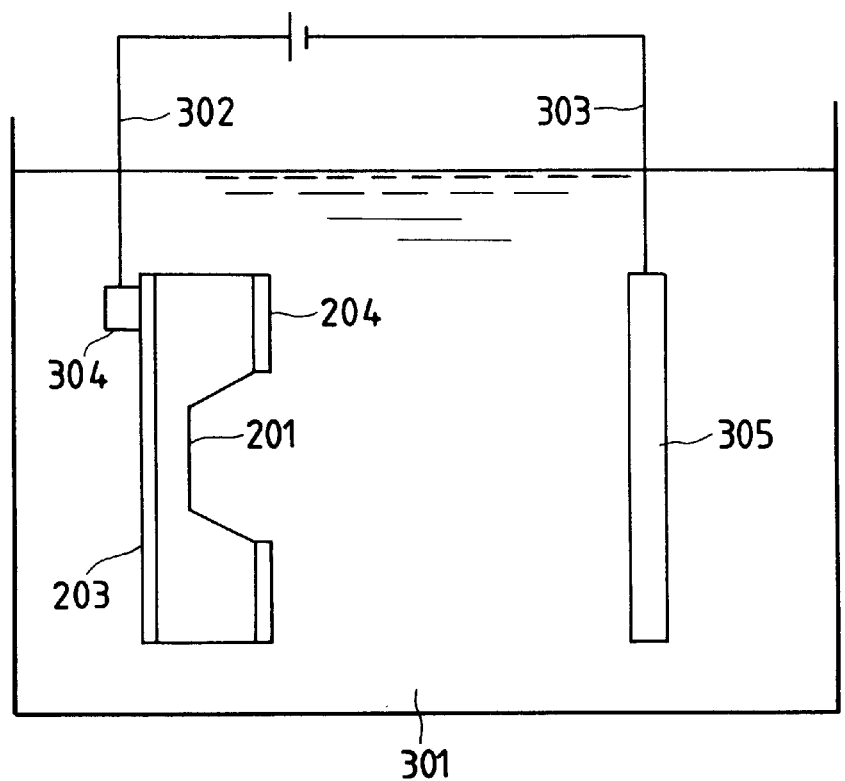
FIG. 15 is a diagrammatic illustration of electrolytic etching.

The resulting substrate is further subjected to electrolytic etching. The electrolytic etching is conceptionally illustrated in FIG. 15.

First, the substrate 201 is brought into contact with a metal electrode 304, and a positive voltage 302 is applied thereto. An opposing electrode 305 is formed using a platinum plate, and a negative voltage 303 is applied thereto. An etching solution (an etchant) 301 is an ethylenediamine-pyrocatechol-water mixed solution with a compositional ratio of 7.5 liter ethylenediamine, 1.2 kg pyrocatechol and 2.4 liter water. Temperature is set at 110° C. and stirring is thoroughly carried out.

This electrolytic etching has been developed by T. N. Jackson et al., and is disclosed in detail in IEEE Device Letters, Vol. EDL-2, No. 2 (1981, p.44). Besides the above etching solution, the etching can also be carried out using KOH, TMAH or the like.

In this electrolytic etching, because of a large selectivity ratio between the substrate 201 and the diffusion layer 203, the etching actually stops at its joint surface to the diffusion layer 203. The etching proceeds at a rate of 15,000 Å/min in the p-region and 5 Å/min in the n-region, so that the selectivity ratio is about 3,000.

Figure 14C:
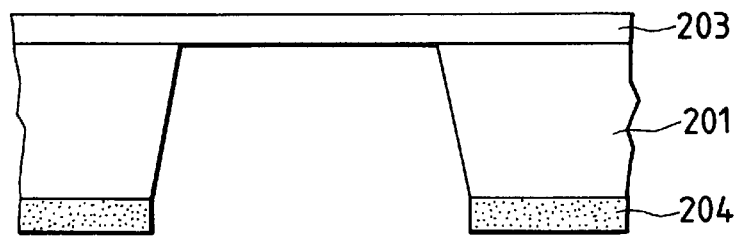

Finally, as a result of the electrolytic etching, the n-type diffusion layer (thin film) 203 remains only at the desired place (FIG. 14C).

If the polarity of the electrolytic etching is reversed, it is also possible to leave a p-type diffusion layer.

Figure 14D:
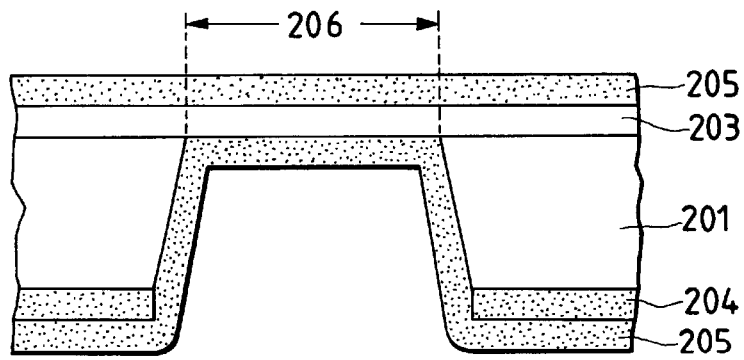

Thereafter, this thin-film diffusion layer 203 is oxidized, whereby this thin film is formed into an SOI substrate 206 (FIG. 14D).

EXAMPLE 6

In Example 5, a process for preparing the SOI substrate has been described. In the present Example, a method by which this substrate is made light-transmissive to the visible light region will be further described.

Figure 16:
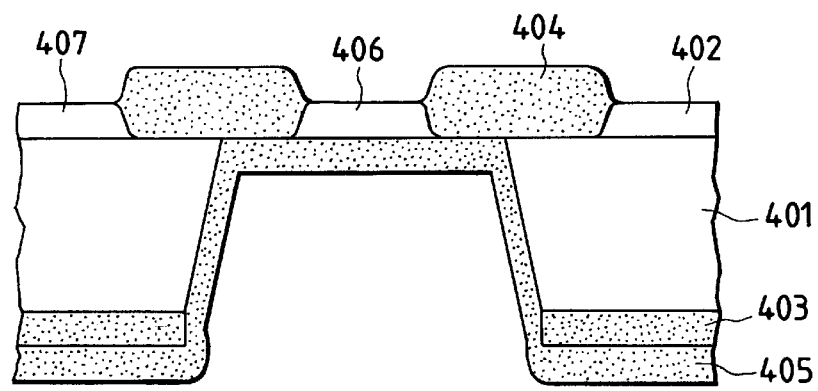
FIG. 16 is a diagrammatic cross section of a semiconductor substrate applicable in the semiconductor device of the present invention.
Figure 17:
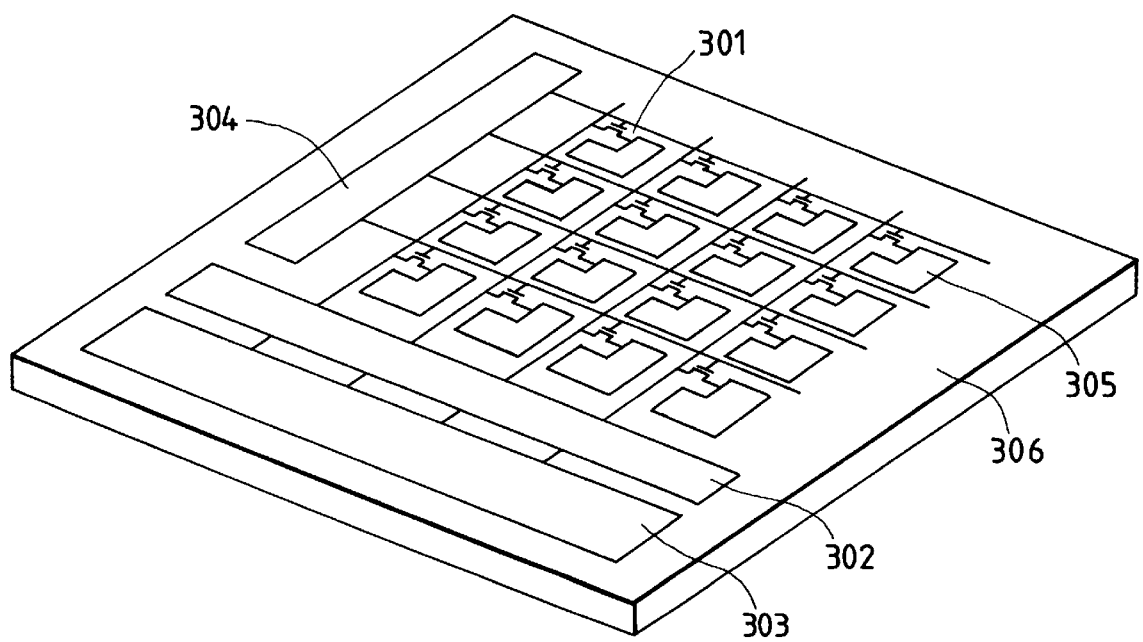
FIG. 17 is a schematic illustration of the construction of a drive circuit for active matrix type liquid crystal display elements conventionally used.

FIG. 16 is a diagrammatic cross section to illustrate the present Example.

In FIG. 16, reference numeral 401 denotes a silicon substrate; 402, a diffusion layer; 403, a mask material used when silicon is etched; 404, a thermal oxide layer; and 405, an insulating layer for reinforcing the thin film.

The process for preparing the substrate of the present Example is the same as that in Example 5 up to the step described in relation to FIG. 14C. A step characteristic of the present Example will be described below in detail with reference to FIG. 16, in particular, the step of forming a transparent insulating film 405.

An oxidation-resistant layer is formed on the layer 402. The film is removed by patterning at its part to be made light-transmissive. Subsequently, this is oxidized at a high temperature of 500° C. or above, so that part of the semiconductor substrate is oxidized and light-transmitting insulating films 404 and 405 are formed.

The constitution taken in this way makes it possible to form an SOI device in a diffusion layer region 406 not subjected to oxidation and to form a usual device in a diffusion layer region 407.

It is also possible to obtain, as previously described, the SOI structure in which a semiconductor layer 406 is formed on a light-transmitting insulating film 405. This enables easy formation of a structure advantageous for the construction of photosemiconductor devices that require a light-transmitting portion such as liquid crystal display devices or the like.

When, for example, this is applied for a liquid crystal display device, an MOS transistor for switching picture elements may be formed on the region 406 and a peripheral drive circuit such as a shift register may be formed in the region 407. Thus, a device capable of high-speed drive can be readily obtained.

At the groove formed by applying the electrolytic etching, silicone rubber, epoxy resin, SiN$_x$, SiO$_x$, or the like may be deposited so that the film strength of the region 406 can be improved.

As described above, the present invention employs the substrate comprised of a portion constituted of a light-transmitting film having light transmission properties and another portion constituted of a semiconductor monocrystalline region, which substrate comprises a semiconductor monocrystalline substrate on one principal surface side of which a light-transmitting film is formed and is prepared by removing from the other side principal surface thereof a semiconductor monocrystalline region present right beneath the light-transmitting film. The light-transmitting film on this substrate is provided with a semiconductor element not required to have a performance comparable to that of a monocrystal, and the semiconductor monocrystalline region of the substrate is provided with a monocrystalline semiconductor element. This makes it possible to integrally form on the same substrate the semiconductor element (not required to have a performance comparable to that of a monocrystal) that must be formed on a light-transmitting substrate and the semiconductor element required to have a high performance.

In the present invention, the semiconductor element that must be formed on a light-transmitting substrate and the semiconductor element required to have a high performance can be integrally formed on the same substrate, and hence the respective semiconductor elements can be electrically connected without fabricating them on the respectively different substrate and wiring them through mechanical connection such as wire bonding.

In the present invention, the circuit required to have a high performance can be provided on the semiconductor monocrystalline substrate so as to be constituted of a monocrystalline element. Hence, there may occur no problems such that the device must be made larger in size when such circuit is constituted of a non-monocrystal and the circuit must be complicatedly designed (e.g., block-divided driving).

Thus, it is possible to greatly decrease mounting cost and to provide a semiconductor device that can be more advantageous as the picture elements have a higher density.

What is claimed is:

1. A semiconductor device, comprising:
    a substrate comprising a semiconductor monocrystalline substrate having one principal surface side on a portion of which an insulating light-transmitting film is formed; said substrate having on the other principal surface side thereof a semiconductor monocrystalline region except beneath said portion bearing said insulating light-transmitting film;

a non-monocrystalline semiconductor element formed on said insulating light-transmitting film; and a monocrystalline semiconductor element being formed in a semiconductor monocrystalline region peripherally around said insulating light-transmitting film in said substrate;

said non-monocrystalline semiconductor element and said monocrystalline semiconductor element being electrically connected.

2. The semiconductor device according to claim 1, wherein said non-monocrystalline semiconductor element comprises a semiconductor element formed of a polycrystalline silicon or an amorphous silicon.

3. The semiconductor device according to claim 1, wherein said semiconductor monocrystalline substrate comprises a silicon monocrystalline substrate having a (100) plane on its principal surface.

4. A liquid crystal display device, comprising:

a substrate comprising a semiconductor monocrystalline substrate having one principal surface side on a portion of which an insulating light-transmitting film is formed; said substrate having on the other side principal surface thereof a semiconductor monocrystalline region except beneath said portion bearing said insulating light-transmitting film;

an active matrix element formed on said insulating light-transmitting film; and a drive circuit being formed in a semiconductor monocrystalline region peripherally around said insulating light-transmitting film in said substrate;

said active matrix element and said drive circuit being electrically connected.

5. The liquid crystal display device according to claim 4, wherein said active matrix element comprises a thin film diode or thin film transistor formed of a polycrystalline silicon or an amorphous silicon.

6. The liquid crystal display device according to claim 4, wherein said semiconductor monocrystalline substrate comprises a silicon monocrystalline substrate having a (100) plane on its principal surface.

7. The semiconductor device according to claim 1, wherein said insulating light-transmitting film has a stress-controlling multi-layer structure.

8. The semiconductor device according to claim 7, wherein the multi-layer structure comprises a silicon oxide layer and a silicon nitride layer.

9. The liquid crystal display device according to claim 6, wherein said insulating light-transmitting film has a stress-controlling multi-layer structure.

10. The liquid crystal display device according to claim 9, wherein the multi-layer structure comprises a silicon oxide layer and a silicon nitride layer.

11. The liquid crystal display device according to claim 4, further comprising a glass substrate arranged in opposition to said substrate and a liquid crystal sandwiched between said substrate and the glass substrate.

12. The liquid crystal display device according to claim 11, further comprising an alignment layer provided on said insulating light-transmitting film.

13. A semiconductor device comprising:

substrate comprising a monocrystalline semiconductor and having a light-transmission portion and a non-light-transmission portion occupying the periphery of said light-transmission portion, said substrate having one principal surface side on at least said light-transmission portion of which an insulating light-transmitting film is formed and having on the other principal surface side thereof a monocrystalline semiconductor region at said non-light-transmission portion except at said light-transmission portion;

a non-monocrystalline semiconductor element formed on said insulating light-transmitting film; and a monocrystalline semiconductor element formed in said monocrystalline semiconductor region of said substrate.

14. The semiconductor device according to claim 13, wherein said non-monocrystalline semiconductor element comprises a semiconductor element formed of a polycrystalline silicon or an amorphous silicon.

15. The semiconductor device according to claim 13, wherein said substrate comprises a monocrystalline silicon substrate.

16. The semiconductor device according to claim 15, wherein said substrate has a plane as its principal surface.

17. The semiconductor device according to claim 15, wherein said insulating light-transmitting film comprises a silicon oxide film formed by oxidizing a surface of said monocrystalline silicon substrate.

18. The semiconductor device according to claim 13, wherein said insulating light-transmitting film has a stress-controlling multi-layer structure.

19. The semiconductor device according to claim 18, wherein the multi-layer structure comprises a silicon oxide layer and a silicon nitride layer.

20. A liquid crystal display device, comprising:

a substrate comprising a monocrystalline semiconductor and having an image display portion and a peripheral portion occupying the periphery of said image display portion, said substrate having one principal surface side on at least said image display portion on which an insulating light-transmitting film is formed and having on the other principal surface side thereof a monocrystalline semiconductor region at said peripheral portion except at said image display portion;

an active matrix element comprising a non-monocrystalline semiconductor element formed on said insulating film; and a drive circuit formed in said monocrystalline semiconductor region of said substrate.

21. The liquid crystal display device according to claim 20, wherein said active matrix element comprises a thin film diode or thin film transistor formed of a polycrystalline silicon or an amorphous silicon.

22. The liquid crystal display device according to claim 20, wherein said substrate comprises a monocrystalline silicon substrate.

23. The liquid crystal display device according to claim 22, wherein said substrate has a plane as its principal surface.

24. The liquid crystal display device according to claim 22, wherein said insulating light-transmitting film comprises a silicon oxide film formed by oxidizing a surface of said monocrystalline silicon substrate.

25. The liquid crystal display device according to claim 20, wherein said insulating light-transmitting film has a stress-controlling multi-layer structure.

26. The liquid crystal display device according to claim 25, wherein the multi-layer structure comprises a silicon oxide layer and a silicon nitride layer.

27. The liquid crystal display device according to claim 20, further comprising a glass substrate arranged in opposition to said substrate and a liquid crystal sandwiched between said substrate and the glass substrate.

28. The liquid crystal display device according to claim 27, further comprising an alignment layer provided on said insulating light-transmitting film.

* * * * *

UNITED STATES PATENT AND TRADEMARK OFFICE
CERTIFICATE OF CORRECTION

PATENT NO. : 6,128,052
DATED : October 3, 2000
INVENTOR(S) : Tetsuo Asaba et al.

It is certified that error appears in the above-identified patent and that said Letters Patent is hereby corrected as shown below:

Column 1:
Line 47, "abut" should read --about--.

Column 2:
Line 27, "liquid. Crystal" should read --liquid crystal--.

Column 6:
Line 46, "fill" should read --filled-- and
Line 61, "be those" should read --be of those--.

Column 7:
Line 55, "over" should be deleted; and
Line "FIG. 4. )" should read --FIG. 4.).--.

Column 9:
Line 57, "hydroxidie" should read --hydroxide--.

Column 10:
Line 7, "cause" should read --causes--; and
Line 51, "101" should read --101 is--.

Column 11:
Line 20, "hydroxidie" should read --hydroxide--.

Column 12:
Line 14, "hydroxidie" should read --hydroxide--.

UNITED STATES PATENT AND TRADEMARK OFFICE
CERTIFICATE OF CORRECTION

PATENT NO. : 6,128,052
DATED : October 3, 2000
INVENTOR(S) : Tetsuo Asaba et al.

It is certified that error appears in the above-identified patent and that said Letters Patent is hereby corrected as shown below:

Column 14:
Line 47, "substrate" should read --substrates--.

Column 15:
Line 46, "claim 6," should read --claim 4,--.

Signed and Sealed this

Nineteenth Day of June, 2001

*Attest:*

NICHOLAS P. GODICI
*Attesting Officer*     *Acting Director of the United States Patent and Trademark Office*